(12) United States Patent
Rosen

(10) Patent No.: US 6,549,039 B1
(45) Date of Patent: Apr. 15, 2003

(54) HI GAIN CLOCK CIRCUIT

(75) Inventor: Eitan E. Rosen, Abirim (IL)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/670,560

(22) Filed: Sep. 27, 2000

(51) Int. Cl.[7] .............................. H03K 3/02; H03L 7/00
(52) U.S. Cl. ......................... 326/93; 326/95; 326/83; 327/142; 327/198
(58) Field of Search .............................. 326/93, 95, 98, 326/83; 327/142, 198, 210

(56) References Cited

U.S. PATENT DOCUMENTS 5,467,037 A * 11/1995 Kumar et al. ............... 327/142
5,796,282 A * 8/1998 Sprague et al. ............. 327/210
6,011,410 A * 1/2000 Kim et al. .................... 326/98

* cited by examiner

Primary Examiner—Daniel Chang
(74) Attorney, Agent, or Firm—Antonelli, Terry, Stout, Kraus, LLP

(57) ABSTRACT

A high gain clock circuit that includes an input section that receives an input clock on an input section input. A self terminating pre-charge section is connected to the input section and includes domino logic. An output section is connected to the self terminating pre-charge section and produces an output clock at an output section output. The clock circuit encompasses a small area and achieves high gain at the output section output relative to the input section input. The high gain clock circuit has higher gain than known circuits and is characterized by fast rise time and slower fall time.

11 Claims, 4 Drawing Sheets

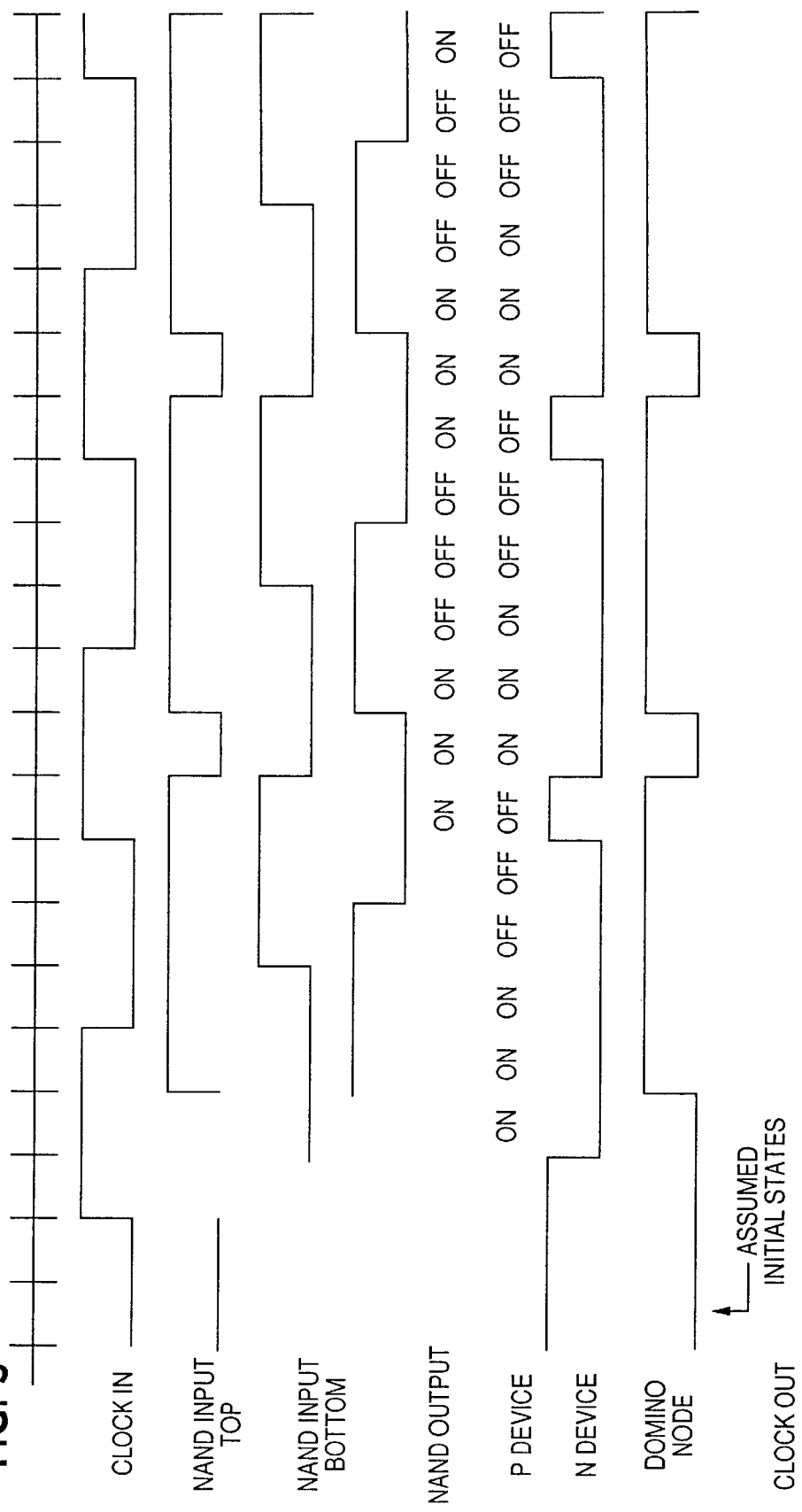

HI GAIN CLOCK CIRCUIT

BACKGROUND

1. Field

This invention relates to logic circuits, and more specifically to clock logic circuits with hi gain.

2. Background

A significant number of processing devices use clock logic in their circuitry. The clocks from the clock logic may be generated or buffered by clock logic circuitry contained as a part of the processing device, or exterior to the processing device. Depending on the specific design of this clock circuitry, the gain (e.g., output load/input load) produced at the clock circuit output with respect to the input to the clock circuit may vary.

FIG. 1 shows an example simple clock buffer circuit. This circuit is composed of an inverter gate 10 that receives a clock input and passes this onto a second inverter gate 12. The size of inverters 10 and 12 may have been determined by the designer of this circuit so that the circuit achieves a particular gain. Gain is defined as the capacitance out of the circuit divided by the capacitance coming into the circuit and relates to the amount of load being driven by the output of the circuit as compared with the load at the input to the circuit. The size of inverters 10 and 12 are usually determined to achieve a given timing specification and, therefore, achieve a specific gain. For example, a typical gain for the circuit of FIG. 1 may be gain=14.

FIG. 2 shows an example clock circuit that has been designed to produce a desired clock output waveform. In this circuit, inverter 10 receives a clock in just as in FIG. 1. The output of inverter 10 is connected to a second inverter 14 and a NAND gate 18. The output of inverter 14 is connected to a third inverter 16, whose output is connected to a second input of NAND gate 18. The output of NAND gate 18 produces the desired clock output waveform.

The design of the clock circuit shown in FIG. 2 produces a clock output signal that transitions from a logic '0' to a logic '1' two inverter device delays after the clock input transitions from a '0' to a '1'. Further, the clock output transitions from a logic '1' to a logic '0' four inverter device delays after the input clock transitions from a '1' to a '0'. In the circuit of FIG. 2, with the load on the output of NAND gate 18 being the same as the load on the output of inverter 12 in FIG. 1, the gain of the circuit shown in FIG. 2 is approximately equal to ten. The clock circuit shown in FIG. 2 produces a clock that may be used in circuits such as domino logic circuits that may require a clock signal with these properties. Note that the gain of the circuit shown in FIG. 2 has degraded as compared with that of FIG. 1. This is because NAND gate 18 is less efficient in that it has a bigger input capacitance, thus causing the circuit of FIG. 2 to achieve only a gain equal to ten. However, since in this example the inverter gates in FIG. 2 are approximately the same size as those shown in FIG. 1, the circuit in FIG. 2 actually takes up more space than the circuit in FIG. 1 while producing less output gain.

Therefore, a need exists for a clock circuit for domino logic and other logic that produces the same function (i.e., clock output waveform) for a given load as the circuit in FIG. 2, but achieves high gain while occupying a minimum amount of space.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein:

FIG. 5 is a timing diagram of a high gain clock circuit according to the example embodiment of the present invention shown in FIG. 4.

DETAILED DESCRIPTION

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments (e.g., servers).

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to a high gain clock circuit that achieves a high gain at the output of the clock circuit as compared with the input. Further, a high gain clock circuit according to the present invention incorporates domino logic principles and uses smaller gate sizes that allow the clock circuit to take up a relatively small amount of area.

Figure 3:
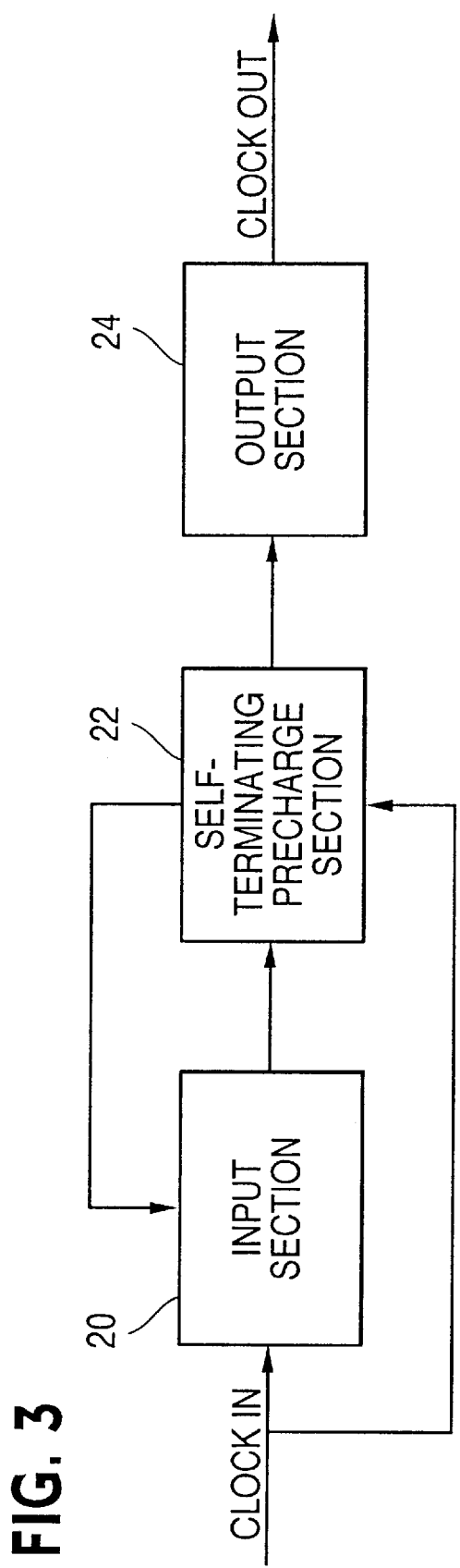
FIG. 3 is an example architecture of a high gain clock circuit according to an example embodiment of the present invention.

FIG. 3 shows an example architecture of a high gain clock circuit according to an example embodiment of the present invention. In the architecture shown in FIG. 3, a clock signal is received by an input section 20, sent to a self terminating pre-charge section 22, and then sent to an output section 24. A desired clock waveform (clock output) is produced at the output of output section 24. The architecture includes a feedback path from self terminating pre-charge section 22 back to the input section 20. The input section may consist of one or more logic gates that receive the input clock, as well as the feedback path from the self terminating pre-charge section 22. The self terminating pre-charge section may consist of domino logic which may include p-type and/or n-type devices. The clock input may also be sent to domino logic contained in self terminating pre-charge section 22. Output section 24 may consist of a simple buffer (e.g., an inverter) or more extensive logic that help formulate and/or buffer the clock output from the high gain clock circuit.

Basic domino logic consists of a standard domino gate which is composed of a dynamic gate (e.g., a p-type and/or n-type device) and an inverter. Domino logic includes a pre-charge phase and an evaluation phase. During the pre-charge phase (i.e., clock in is '0'), the output of the dynamic gate is set to logic '1'. This sets the output from the inverter to logic '0'. During the evaluation phase (i.e., clock in is '1'), the output of the dynamic gate may either switch from a '1' to '0' or stay the same depending on the inputs to the dynamic gate. Any change in the dynamic gate output may also cause the inverter's output to change. The dynamic gate may be considered a pull-down gate since its output will either switch from a '1' to a '0' during evaluation or stay the same. The inverter is considered to be a pull-up gate since its output may either switch from '0' to '1' during evaluation or stay the same. Domino logic must guarantee that inputs to dynamic pull-down gates never make '1' to '0' transitions while the circuit is in evaluation, since any lost charge cannot be recovered. This constraint forces all inputs to dynamic gates to only switch from '0' to '1' or stay the same.

Domino principles are used in logic in the self terminating pre-charge section to help provide the desired function of the clock out transitioning from a '0' to a '1' approximately two device (or gate) delays after the clock in transitions from a '0' to a '1', and the clock out transitioning from a '1' to a '0' approximately four device (or gate) delays after the clock in transitions from a '1' to a '0'.

The clock input (i.e., clock in) and the output from the input section feed domino logic inside self terminating pre-charge section 22. The use of domino logic in self terminating pre-charge section 22 allows for logic devices in input section 20 to be considerably small in size. Further, since the clock input to the self terminating pre-charge section 22 feeds domino logic (e.g., a p-type and/or n-type device connected to an inversion device), the input load on the clock input is substantially lower than the clock circuits shown in FIGS. 1 and 2. Moreover, logic gates used in the self terminating pre charge section (e.g., inverter) are also smaller in size than similar devices shown in FIGS. 1 and 2. Therefore, the overall area taken up by a high gain clock circuit according to the present invention is substantially less than traditional circuits such as that shown in FIG. 2. Due to the reduced input load on the signal coming into input section 20, the high gain clock circuit architecture in FIG. 3 attains a substantial gain at the output of output section 24 relative to the input to input section 20.

Figure 4:
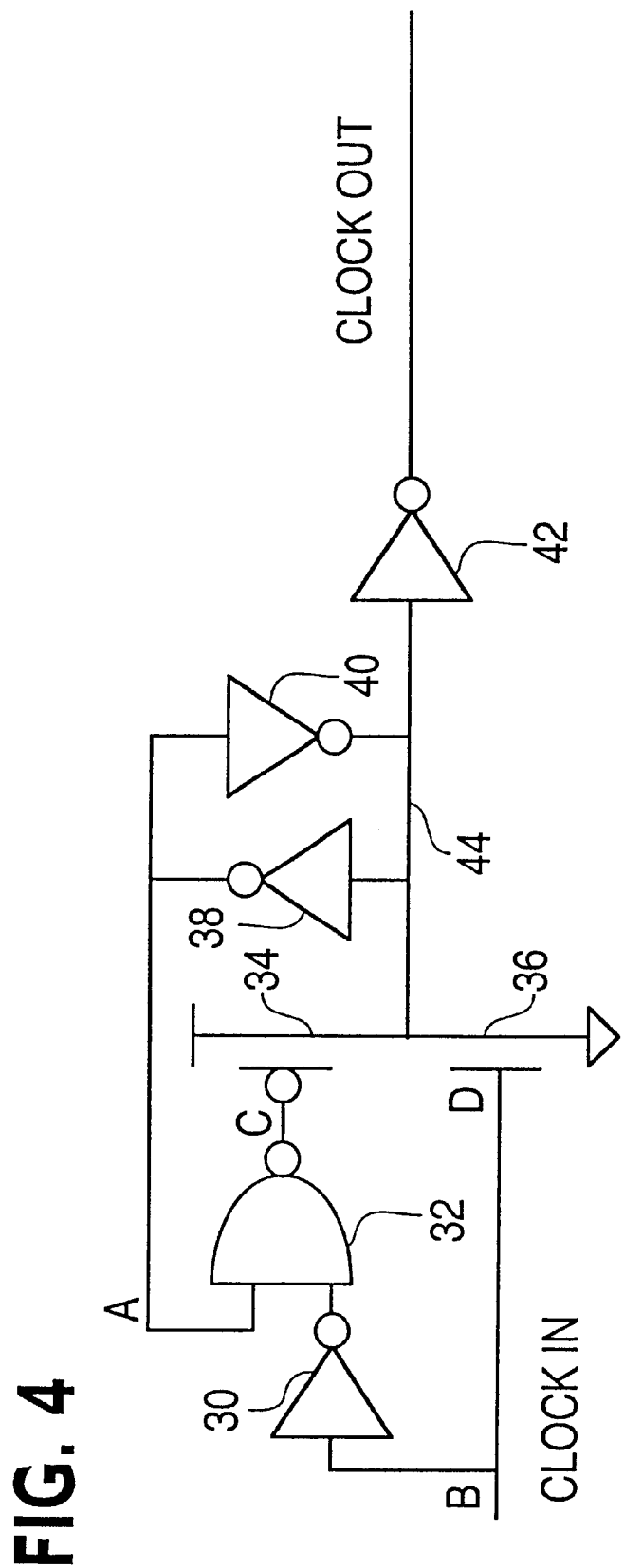
FIG. 4 is a schematic diagram of an example high gain clock circuit according to an example embodiment of the present invention.

FIG. 4 shows a schematic diagram of an example high gain clock circuit according to an example embodiment of the present invention. In this example circuit, inverter 30 and NAND gate 32 may reside in the input section of the clock circuit. P-type device 34, n-type device 36 and inverters 38 and 40 may reside in the self terminating pre charge section of the clock circuit. Inverter 42 resides in the output section of the clock circuit and supplies the created clock output to other circuits/devices.

The input to the clock circuit shown in FIG. 4 receives a clock in signal at the input to inverter 30 (B) and the gate of n-type device 36 (D). The output of inverter 30 is connected to one input of NAND gate 32. The source of n-type device 36, is connected to a node 44, which for the purpose of illustration we shall call the "domino node". The domino node is connected to the input of inverter 38, the output of inverter 40, and the input of inverter 42. The output of inverter 38 is connected to the input of inverter 40, and to a second input of NAND gate 32 (A). The output of NAND gate 32 (C) is connected to the gate of p-type device 34. The drain of p-type device 34 is connected to domino node 44. As shown in FIG. 4, D=C. Further, it can be seen that the output C of NAND gate 32 can be represented by the following equation where "NOT A" represents the invert of A:

$$C = \text{NOT}A + (A * B) \tag{1}$$

To illustrate the operation of the circuit shown in FIG. 4, we will assume some initial states. It is assumed that the clock input is equal to '0', the domino node equal to '1', and the clock output is equal to '0'. Since the domino node='1', the top input of NAND gate 32 will be equal to '0' due to the inversion performed by inverter 38. Inverter 40 is a small inverter and is used only to hold a given state at the domino node 44. P-type device 34 or n-type device 36 will override inverter 40 in driving domino node 44. When the clock input transitions from a '0' to a '1', a '1' is sent to the gate of n-type device 36 and n-type device 36 will turn on. This will cause current to be sinked by n-type device 36, therefore, pulling down domino node 44 to a '0'. Domino node 44 will become '0' approximately one gate/device delay (i.e., delay through n-type device 36) after the clock input at the gate of n-type device 36 becomes a '1'. After domino node 44 becomes a '0', the clock output will transition from a '0' to a '1' after approximately one gate/device delay (i.e., through inverter 42) from domino node 44 becoming a '0'. Therefore, the clock output transitions from a '0' to a '1' two gate/device delays after the clock input transitions from a '0' to a '1'. With domino node 44 at a '0', inverter 38 puts a '1' at the top input of NAND gate 32. The clock input being a '1' causes inverter 30 to send a '0' to the bottom input of NAND gate 32. With a '0' at one input of NAND gate 32, the output of NAND gate 32 is a '1' which is sent to the gate of p-type device 34. Thus, p-type device 34 remains off. Since: (1) there is only approximately one gate/device delay between the clock input transitioning from a '0' to a '1' and this result being seen at the bottom input of NAND gate 32, and (2) there is approximately a two gate/device delay between the clock input transitioning from a '0' to a '1' and the result being seen at the top input of NAND gate 32, at no time is both inputs to NAND gate 32 equal to a '1'.

The clock circuit in FIG. 4 is now waiting for the clock input to transition from a '1' to a '0'. Once the clock input goes from '1' to '0', a '0' on the gate of n-type device 36 causes n-type device 36 cuts off. Approximately one gate/device delay later, the output of inverter 30 puts a one at the bottom input of NAND gate 32. Therefore, both inputs of NAND gate 32 will be equal to '1' since the feedback path at the top input of NAND gate 32 is already equal to '1'. Thus, NAND gate 32 outputs a '0' to the gate of p-type device 34. This turns p-type device 32 on and charges domino node 44 back up to a '1'. This causes inverter 38 to drive a '0' on the feedback to the top input of NAND gate 32. A '0' at the top input of NAND gate 32 causes NAND gate 32 to send a '1' to the gate of p-type device 34. This turns p-type device 34 off. Thus, two gate/device delays after domino node 44 is equal to a '1', p-device 34 turns off. Thus, the charge at domino node 44 terminates itself. At the next clock input equal to a '1', p-type device 34 is already off, and domino node 44 is at a '1'. This is why it was originally assumed that domino node 44 would be at a '1'.

The high gain clock circuit in FIG. 4 produces a clock output signal that transitions from a '0' to a '1' approximately two gate/device delays after the clock input transitions from a '0' to a '1'. Moreover, the high gain clock circuit in FIG. 4 produces a clock output signal that transitions from a '1' to a '0' approximately four gate/device delays after the clock input transitions from a '1' to a '0'. This produces a clock output that is compatible with domino logic circuits. However, this clock can also be used to drive other logic circuits or systems.

Figure 1:
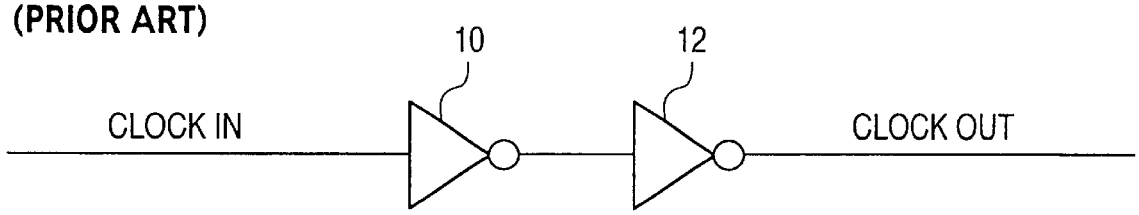
FIG. 1 is an example clock buffer circuit.

Inverter 42 in FIG. 4 and inverter 12 in FIG. 1 are equivalent. The clock in signal in FIG. 1 drives inverter 10 which may be composed of both p-type and n-type devices. However, in FIG. 4, the clock in signal only drives n-type device 36 and inverter 30. Inverter 30, however, is substantially smaller in size than inverter 10 and, therefore, there is substantially less load on the clock in signal. NAND gate 18 in FIG. 2 may be composed of two parallel p-type devices and two n-type devices in series. NAND gate 32 in FIG. 3 is much smaller in size than NAND gate 18 since NAND gate 32 is driving a load (i.e., p-type device 34) that is roughly 50 times smaller than the load likely driven by NAND gate 18 in FIG. 2. Further, inverters 30, 38 and 40 are all substantially smaller in size than the inverters (10, 12, 14, 16, 18) shown in FIGS. 1 and 2. Therefore, the overall area taken by the circuit shown in FIG. 4 is smaller than the area taken by the circuits shown in FIGS. 1 and 2. Moreover, due to the substantially low input load on the input to the clock circuit in FIG. 4, and the assumption that load being driven by the clock circuits in FIGS. 1, 2, and 4 is the same, the gain at the output of the clock circuit in FIG. 4 is substantially higher than the gain achieved in the clock circuits in FIGS. 1 and 2.

FIG. 5 shows a timing diagram of a high gain clock circuit according to the example embodiment of the present invention shown in FIG. 4. The clock input is a wave form with a 50% duty cycle. As noted in FIG. 5, the initial states are assumed to be a clock input of '0', domino node '1', and the clock output equal to '0'. The horizontal axis denotes gate/device delays. To illustrate the present invention, it is assumed that a signal delay through a device (e.g., n-type device) is equal to the delay through a logic gate (e.g., inverter 30). Note that the clock output transitions from a '0' to a '1' two gate/device delays after the clock input transitions from a '0' to a '1'. Further, the clock output transitions from a '1' to a '0' four gate/device delays after the clock input transitions from a '1' to a '0'. The timing of the signals in the clock circuit in FIG. 4 was discussed previously during discussion of the operation of the clock circuit in FIG. 4 and need not be repeated here.

A high gain clock circuit according to the present invention may be in the form of a logic circuit that is part of a larger circuit, or may be a self-contained circuit packaged alone in an Integrated Circuit (IC). Further, a high gain clock circuit according to the present invention may be in the form of a clock macro that may be used as a logic block with defined inputs and outputs that supplies its clock output to other logic on a motherboard, or a clock macro that is a functional block used as part of the design of circuits on a silicon wafer. Additionally, a high gain clock circuit according to the present invention may be in any of many circuit technologies (e.g., transistor-transistor logic (TTL), emitter-coupled logic (ECL), complementary metal-oxide semiconductor (CMOS), etc.) and still be within the spirit and scope of the present invention. Moreover, the down delay in a high gain clock circuit according to the present invention may be adjusted from approximately four gate delays to other (even number) delays by adding buffers on the feedback path.

Figure 2:
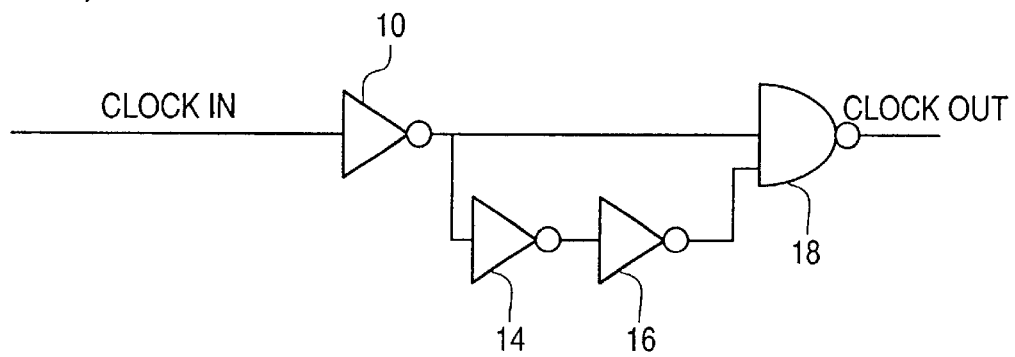
FIG. 2 is an example clock circuit that has been designed to produce a desired clock output waveform.

In a high gain clock circuit according to the present invention, the clock circuit clock output behaves identical to the output of the clock circuit shown in FIG. 2, but at approximately ¼ the input load, and approximately ½ the area. This is advantageous in that it allows faster design conversions (speed) and low power at reduced clock load, also allows flexibility and better granularity of clock gating allowing for more power savings. Moreover, the power consumption of a high clock gain circuit according to the present invention approximately three times smaller than circuits such as those shown in FIG. 2.

It is noted that the foregoing examples have been provided merely for the purpose of explanation and are in no way to be construed as limiting of the present invention. While the present invention has been described with reference to a preferred embodiment, it is understood that the words which have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A high gain clock circuit comprising:
   input section, the input section receiving an input clock on an input section input;
   a self terminating pre-charge section operatively connected to the input section, the self terminating pre-charge section including domino logic;
   an output section operatively connected to the self terminating pre-charge section, the output section producing an output clock at an output section output,
   wherein the output clock transitions from a low level to a high level approximately two device delays after the input clock transitions from a low level to a high level, and the output clock transitions from a high level to a low level approximately four device delays after the input clock transitions from a high level to a low level, the clock circuit encompassing a small area and achieving high gain at the output section output relative to the input section input.

2. The circuit according to claim 1, the input section further comprising:
   an inverting device, the inverting device receiving the input clock on an inverting device input; and
   a NAND device, a first input of the NAND device operatively connected to an output of the inverting device, a second input of the NAND device operatively connected to an output of the self terminating pre-charge section, an output of the NAND device operatively connected to an input of the self terminating pre-charge section.

3. The circuit according to claim 2, wherein the inverting device is an inverter logic gate.

4. The circuit according to claim 1, wherein the input clock is a waveform with a fifty percent duty cycle.

5. The circuit according to claim 2, wherein the first inverting device and the second inverting device comprise one of an inverter logic gate and a NAND logic gate.

6. A high gain clock circuit comprising:

a first inverting device, the first inverting device receiving a clock at an input of the first inverting device;

an n-type device, the n-type device connected to the input of the first inverting device, the n-type device receiving the clock input;

a second inverting device, an input of the second inverting device connected to an output of the n-type device, an output of the second inverting device producing an output clock;

a third inverting device, an input of the third inverting device connected to the output of the n-type device;

a fourth inverting device, an output of the fourth inverting device connected to the input of the second inverting device;

a NAND device, one NAND device input connected to an output of the third inverting device and an input of the fourth inverting device;

a p-type device connected to an output of the NAND device, wherein the clock circuit encompasses a small area and achieves high gain at the output of the second inverting device relative to the input of the first inverting device, wherein the output clock transitions from a low level to a high level approximately two device delays after the input clock transitions from a low level to a high level, and the output clock transitions from a high level to a low level approximately four device delays after the input clock transitions from a high level to a low level.

7. A high gain clock macro comprising:

an input section, the input section receiving an input clock on an input section input;

a self terminating pre-charge section operatively connected to the input section, the self terminating pre-charge section including domino logic;

an output section operatively connected to the self terminating pre-charge section, the output section producing an output clock at an output section output, wherein the output clock transitions from a low level to a high level approximately two device delays after the input clock transitions from a low level to a high level, and the output clock transitions from a high level to a low level approximately four device delays after the input clock transitions from a high level to a low level, the clock macro encompassing a small area and achieving high gain at the output section output relative to the input section input.

8. An Integrated Circuit (IC) that receives an input signal and provides a high gain at an IC output comprising:

an input section, the input section receiving an input clock on an input section input;

a self terminating pre-charge section operatively connected to the input section, the self terminating pre-charge section including domino logic;

an output section operatively connected to the self terminating pre-charge section, the output section producing an output clock at an output section output, wherein the output clock transitions from a low level to a high level approximately two device delays after the input clock transitions from a low level to a high level, and the output clock transitions from a high level to a low level approximately four device delays after the input clock transitions from a high level to a low level, the IC encompassing a small area and achieving high gain at the output section output relative to the input section input.

9. A high gain clock circuit comprising:

an input section, the input section receiving an input clock on an input section input, the input section including a first input with a logic signal A, the input section input with a logic signal B, a first output with a logic signal C, and a second output with a logic signal D, the input section comprising logic circuits where C=NOT A+(A*B), and D=B, the first output (C) and the second output (D) operatively connected to the self terminating pre-charge section;

a self terminating pre-charge section operatively connected to the input section, the self terminating pre-charge section including domino logic;

an output section operatively connected to the self terminating pre-charge section, the output section producing an output clock at an output section output, wherein the clock circuit encompassing a small area and achieving high gain at the output section output relative to the input section input.

10. A high gain clock circuit comprising:

an input section, the input section receiving an input clock on an input section input;

a self terminating pre-charge section operatively connected to the input section, the self terminating pre-charge section including domino logic, the self terminating pre-charge section further comprising:

a p-type device, an input of the p-type device operatively connected to a first output from the input section;

an n-type device, an input of the n-type device receiving the input clock from a second output from the input section;

a first inverting device, an input of the first inverting device operatively connected to an output from the n-type device and an output from the p-type device, an output from the n-type device operatively connected to the input section; and a second inverting device, an input of the second inverting device operatively connected to the output of the first inverting device, an output of the second inverting device operatively connected to the input of the first inverting device and the output section; and an output section operatively connected to the self terminating pre-charge section, the output section producing an output clock at an output section output, wherein the clock circuit encompassing a small area and achieving high gain at the output section output relative to the input section input.

11. The circuit according to claim 10, wherein the first inverting device and the second inverting device comprise one of an inverter logic gate and a NAND logic gate.

* * * * *